US011579647B2

(12) United States Patent
Bickel

(10) Patent No.: US 11,579,647 B2
(45) Date of Patent: Feb. 14, 2023

(54) SYSTEMS AND METHODS FOR MANAGING ENERGY-RELATED STRESS IN AN ELECTRICAL SYSTEM

(71) Applicant: Schneider Electric USA, Inc., Andover, MA (US)

(72) Inventor: Jon A. Bickel, Murfreesboro, TN (US)

(73) Assignee: Schneider Electric USA, Inc., Boston, MA (US)

( * ) Notice: Subject to any disclaimer, the term of this patent is extended or adjusted under 35 U.S.C. 154(b) by 0 days.

(21) Appl. No.: 17/716,463

(22) Filed: Apr. 8, 2022

(65) Prior Publication Data

US 2022/0229458 A1    Jul. 21, 2022

Related U.S. Application Data

(63) Continuation of application No. 16/841,493, filed on Apr. 6, 2020, now Pat. No. 11,314,272.

(Continued)

(51) Int. Cl.
    *G05F 1/66*      (2006.01)
    *G01R 31/08*      (2020.01)
(Continued)

(52) U.S. Cl.
    CPC .............. *G05F 1/66* (2013.01); *G01R 31/088* (2013.01); *G01R 31/12* (2013.01); *G05B 13/048* (2013.01);
(Continued)

(58) Field of Classification Search
    CPC ......... G05F 1/66; G01R 31/088; G01R 31/12; H02H 7/20
See application file for complete search history.

(56) References Cited

U.S. PATENT DOCUMENTS 9,997,919 B2 * 6/2018 Cho .......................... H02J 3/24
2006/0241793 A1 * 10/2006 Skourup ............. G06F 3/04845
    700/83
(Continued)

FOREIGN PATENT DOCUMENTS

WO      2019195582 A1    10/2019

OTHER PUBLICATIONS

Extended European Search Report dated Feb. 11, 2021 for European Patent Application No. 20200618.5 (9 pages).
(Continued)

*Primary Examiner* — Adolf D Berhane
*Assistant Examiner* — Afework S Demisse
(74) *Attorney, Agent, or Firm* — Locke Lord LLP

(57) ABSTRACT

A method for reducing and/or managing energy-related stress in an electrical system includes processing electrical measurement data from or derived from energy-related signals captured by at least one intelligent electronic device (IED) in the electrical system to identify and track at least one energy-related transient in the electrical system. An impact of the at least one energy-related transient on equipment in the electrical system is quantified, and one or more transient-related alarms are generated in response to the impact of the at least one energy-related transient being near, within or above a predetermined range of the stress tolerance of the equipment. The transient-related alarms are prioritized based in part on at least one of the stress tolerance of the equipment, the stress associated with one or more transient events, and accumulated energy-related stress on the equipment. One or more actions are taken in the electrical system in response to the transient-related alarms to reduce energy-related stress on the equipment in the electrical system.

27 Claims, 7 Drawing Sheets

Related U.S. Application Data

(60) Provisional application No. 62/914,207, filed on Oct. 11, 2019.

(51) Int. Cl.
| | |
|---|---|
| *G01R 31/12* | (2020.01) |
| *G05B 13/04* | (2006.01) |
| *G05B 23/02* | (2006.01) |
| *H02H 7/20* | (2006.01) |
| *H02H 9/04* | (2006.01) |

(52) U.S. Cl.
CPC ............ *G05B 23/027* (2013.01); *H02H 7/20* (2013.01); *H02H 9/042* (2013.01)

(56) References Cited

U.S. PATENT DOCUMENTS

| | | |
|---|---|---|
| 2012/0321093 A1 | 12/2012 | Borras et al. |
| 2015/0005970 A1 | 1/2015 | Zweigle et al. |
| 2016/0252367 A1 | 9/2016 | Banhegyesi et al. |

OTHER PUBLICATIONS

European Office Action dated May 2, 2022 for European Patent Application No. 20 200 618.5-1202, 4 pages.

\* cited by examiner

SYSTEMS AND METHODS FOR MANAGING ENERGY-RELATED STRESS IN AN ELECTRICAL SYSTEM

CROSS REFERENCE TO RELATED APPLICATION

This application is a continuation of U.S. application Ser. No. 16/841,493, filed on Apr. 6, 2020, which claims the benefit of and priority to U.S. Provisional Application No. 62/914,207, filed on Oct. 11, 2019 under 35 U.S.C. § 119(e), which applications are incorporated by reference herein in their entirety.

FIELD

This disclosure relates generally to electrical/power systems, and more particularly, to systems and methods for analyzing, quantifying and managing energy-related stress in an electrical system.

BACKGROUND

As is known, transient overvoltages that exceed insulation ratings can stress electrical insulation, leading to gradual breakdown or abrupt failure of the dielectric. It is not uncommon for an industrial facility to experience many transients every hour with voltage impulses exceeding five to ten times the nominal system voltage. Reducing the magnitude and duration of voltage transients can extend the life of equipment insulation resulting in longer equipment operational life.

Because damage due to transient voltages may not be obvious, identifying the root cause of equipment damage is challenging and often diagnosed as "unknown." Many integrated circuit and component failures result from voltage transients, and large equipment such as induction motors are also susceptible to costly voltage transient damage. It has been estimated that billions of dollars in electronic equipment losses occur globally each year due to voltage transients, with these numbers increasing yearly as technology evolves.

SUMMARY

Described herein are systems and methods related to reducing/managing energy-related stress in an electrical system, for example, due to transient voltages and other energy-related transients. The electrical system may be associated with at least one load, process, building, facility, watercraft, aircraft, or other type of structure, for example. In one aspect of this disclosure, a method for reducing/managing energy-related stress in an electrical system includes processing electrical measurement data from or derived from energy-related signals captured by at least one intelligent electronic device (IED) in the electrical system to identify and track at least one energy-related transient in the electrical system. The at least one energy-related transient may include, for example, at least one of a voltage transient and a current transient.

The method also includes quantifying an impact of the at least one energy-related transient on equipment (e.g., machinery, apparatuses and/or components associated with a particular application, applications, and/or process(es)) in the electrical system. Each piece of equipment may have an associated stress tolerance to the at least one energy-related transient, with the stress tolerance being used in quantifying the impact of the at least one energy-related transient.

The method additionally includes generating one or more transient-related alarms in response to the impact of the at least one energy-related transient being near, within or above a predetermined range of the stress tolerance of the equipment. In one embodiment, the transient-related alarms are prioritized based in part on at least one of the energy-related stress tolerance of the equipment, the energy-related stress associated with one or more transient events, and accumulated energy-related stress on the equipment. Additionally, in one embodiment one or more actions are taken in the electrical system in response to the transient-related alarms to reduce energy-related stress on the equipment in the electrical system. As is known, energy-related transients may produce or lead to stresses (e.g., electrical, thermal and mechanical) that may shorten the life of equipment in an electrical system. Therefore, it is desirable to reduce the effects of the energy-related transient and extend the operational life of the equipment. In some embodiments, the actions taken in response to the transient-related alarms are taken based on at least one of the priority and severity of the transient-related alarms to extend the operational life of the equipment. The actions may include, for example, at least one of communicating the occurrence of transient-related alarms associated with the at least one energy-related transient and controlling at least one component (e.g., equipment) in the electrical system, as will be described further below. It is understood that the terms "stress" and "energy-related stress" are used interchangeably throughout the application, and are taken to mean one in the same in accordance with embodiments of this disclosure.

In some embodiments, the above method may be implemented on the at least one IED. Additionally, in some embodiments the above method may be implemented partially or fully remote from the at least one IED, for example, in a gateway, a cloud-based system, on-site software, a remote server, etc. (which may alternatively be referred to as a "head-end" or "Edge" system herein). In some embodiments, the at least one IED may be coupled to measure energy-related signals, receive electrical measurement data from or derived from the energy-related signals at an input, and configured to generate at least one or more outputs. The outputs may be used to indicate and/or analyze effects of energy-related transients on equipment in an electrical system. Examples of the at least one IED may include a smart utility meter, a power quality meter, and/or another measurement device (or devices). The at least one IED may include breakers, relays, power quality correction devices, uninterruptible power supplies (UPSs), filters, and/or variable speed drives (VSDs), for example. Additionally, the at least one IED may include at least one virtual meter in some embodiments.

The above method, and the other methods (and systems) described below, may include one or more of the following features either individually or in combination with other features in some embodiments. For example, in some embodiments the energy-related signals captured by the at least one IED include at least one of: a voltage signal, a current signal, and a derived energy-related value. In some embodiments, the derived energy-related value includes at least one of: a calculated, derived, developed, interpolated, extrapolated, evaluated, and otherwise determined additional energy-related value from the at least one of the voltage signal and the current signal. Additionally, in some embodiments the derived energy-related value(s) include(s) at least one of: active power, apparent power, reactive power, energy, harmonic distortion, power factor, harmonic power, harmonic voltages, harmonic currents, interharmonic currents, interharmonic voltages, interharmonic power, individual phase currents, phase angle, impedance, sequence component, total voltage harmonic distortion, total current harmonic distortion, three-phase currents, phase voltage(s), line voltage(s) or other similar parameters. Further, in some embodiments the derived energy-related value(s) include(s) at least one energy-related characteristic, the energy-related characteristic including magnitude, phase angle, duration, associated frequency components, impedance, energy-related parameter shape, and decay rate. It is understood that the energy-related signals may include (or leverage) substantially any electrical parameter derived from at least one of the voltage and current signals (including the voltages and currents themselves), for example.

In some embodiments, the energy-related signals may be continuously or semi-continuously captured by the at least one IED, and the transient-related alarms may be updated (e.g., generated/re-generated, evaluated/re-evaluated, prioritized/re-prioritized, etc.) in response thereto. For example, transient related alarms may initially be generated in response to at least one energy-related transient identified from energy-related signals captured at a first time, and may be updated or revised in response to (e.g., to include or incorporate) energy-related transients identified from energy-related signals captured at a second time. As energy-related transients are captured, the transient-related alarms may be continuously updated (e.g., re-generated, re-evaluated, re-prioritized, etc.) according to the unique response of the electrical system.

In some embodiments, taking the one or more actions in response to the transient-related alarms to reduce energy-related stress on the equipment in the electrical system includes: identifying at least one means to reduce the energy-related stress on the equipment in the electrical system; selecting one or more of the at least one means to reduce the energy-related stress based on at least one of the priority and severity of the transient-related alarms; and applying the selected one or more of the at least one means to reduce the energy-related stress. In some embodiments, the one or more of the at least one means to reduce the energy-related stress is further selected based on an expected ability of the one or more of the at least one means to reduce at least one of the magnitude and duration of the at least one energy-related transient in the electrical system. Additionally, in some embodiments the one or more of the at least one means to reduce the energy-related stress is further selected based on economic costs associated with acquiring and/or applying the one or more of the at least one means. In some embodiments, the one or more of the at least one means to reduce the energy-related stress includes at least one transient mitigative device. In some embodiments, the at least one transient mitigative device includes at least one of: a surge arrester, a lightning arrestor, a surge suppressor, a line reactor, a snubber, and a transient voltage surge suppressor.

In some embodiments, the actions taken in response to the transient-related alarms are automatically performed by a control system associated with the electrical system. The control system may be used, for example, for controlling one or more parameters associated with the electrical system (which is an example type of action taken) in response to the transient-related alarms. The control system may be a meter, an IED (e.g., an IED of the at least one IED), on-site/head-end/Edge software (i.e., a software system), a cloud-based control system, a gateway, a system in which data is routed over the Ethernet or some other communications system, etc. In embodiments in which the control system is not the at least one IED or does not include the at least one IED, for example, the control system may be communicatively coupled to the at least one IED. The control system may also be communicatively coupled to at least one of: a cloud-based system, on-site software, a gateway, and another head-end or Edge system associated with the electrical system.

In some embodiments, the control system may automatically control at least one component in the electrical system (which is another example type of action that may be taken) in response to the transient-related alarms. The at least one component may correspond to at least one of the equipment for which a transient-related alarm has been generated in response to the impact of the at least one energy-related transient being near, within or above a predetermined range of the energy-related stress tolerance of the equipment. In some embodiments, the at least one component is controlled in response to a control signal generated by the control system, with the control signal indicating/providing for adjustment of at least one parameter associated with the at least one component, other associated components/loads/equipment, or the electrical system.

In some embodiments, the electrical measurement data from or derived from energy-related signals captured by the at least one IED is processed on at least one of: the cloud-based system, the on-site or Edge software, the gateway, and the other head-end system associated with the electrical system. In these embodiments, for example, the at least one IED may be communicatively coupled to the at least one of: the cloud-based system, the on-site or Edge software, the gateway, and the other head-end system on which the electrical measurement data is processed, analyzed, and/or displayed.

In some embodiments, data associated with the at least one energy-related transient is stored (e.g., in a memory device of at least one device or system associated with the electrical system) and/or tracked over a predetermined time period. In some embodiments, the predetermined time period is a user-configured time period.

In some embodiments, the impact of the at least one energy-related transient on the equipment is determined and quantified based on at least one of: the nature and source of the at least one energy-related transient, the susceptibility of the equipment to the at least one energy-related transient, the effect of the equipment on the at least one energy-related transient, and the cost sensitivity of a business's operation and/or infrastructure to the at least one energy-related transient. The effect of the equipment on the at least one energy-related transient may refer, for example, to how the equipment and/or infrastructure attenuates or exacerbates the energy-related transient. Additionally, the cost sensitivity of a business's operation and/or infrastructure to the at least one energy-related transient may refer, for example, to the monetary impact to the business's operation and/or infrastructure due to the transient's effects.

In some embodiments, quantifying the impact of the at least one energy-related transient includes classifying the effects and/or influence of the at least one energy-related transient on the equipment. In some embodiments, the effects of the at least one energy-related transient are classified as at least one of: an intermittent interruption, a chronic degradation, a latent failure, and a catastrophic failure. Definitions of these example types of classifications (and other classifications) are provided in the Detailed Description section of this disclosure. It is understood that intermittent interruptions, chronic degradations, latent failures, and catastrophic failures are but a few of many possible ways in which the at least one energy-related transient may be classified, as will become apparent through this disclosure.

In some embodiments, the method further includes communicating the transient-related alarms, for example, to an end-user, equipment manufacturer, services team and/or other interested individual or party. The communication may include, for example, at least one of: a report, a text, an email, audibly, and an interface of a screen/display (e.g., a display device of a computing device or system associated with the electrical system). The report, text, etc. may present the priority and severity of the transient-related alarms. Additionally, the report, text, etc. may provide actionable recommendations for responding to the transient-related alarms. The transient-related alarms inform an end-user, equipment manufacturer, and/or services team when the equipment nears and/or exceeds a pre-determined threshold of voltage stress energy, for example.

In some embodiments, the stress tolerance of the equipment, and the accumulated energy-related stress on the equipment, may be used to predict the end of life (EOL) of the equipment. For example, as is known, a surge device (which is one example type of equipment) may not have a defined accumulated stress life. In accordance with embodiments of this disclosure, the EOL of the surge device (and other devices lacking a defined accumulated stress life) may be analytically predicted/estimated, for example, based on EOL data for similar products/equipment using accumulated energy-related stress data. In some embodiments, the EOL of the equipment (e.g., surge device) may be predicted using mean time to failure (MTTF), for example, the EOL of the equipment. In some embodiments, the MTTF is based on an evaluation of at least the individual and accumulative impact (s) of energy-related stress. The equipment manufacturing company may prescribe energy-related stress limits in some embodiments. Additionally, the end-user (or other interested party) may prescribe the limits independently. In some embodiments, near EOL or EOL of the equipment may be communicated, for example, to an end-user, equipment manufacturer, and/or services team. Similar to the communication of the transient-related alarms, the communication of the near EOL or EOL of the equipment may include, for example, at least one of: a report, a text, an email, audibly, and an interface of a screen/display. In embodiments in which the equipment has a defined accumulated stress life (in contrast to the example surge device discussed above), as the accumulated energy-related stress approaches and/or exceeds the defined stress life, an indication may be sent to alert the end-user, equipment manufacturer, services team, and/or other interested individual or party, for example.

In some embodiments, the method further includes evaluating one or more characteristics of the at least one energy-related transient to isolate and identify transient origins. Additionally, in some embodiments the method further includes evaluating one or more characteristics of the at least one energy-related transient to identify the source(s) and location(s) of the at least one energy-related transient.

A corresponding system for automatically categorizing disturbances in an electrical system is also provided herein. In particular, in one aspect of this disclosure a system for reducing/managing energy-related stress in an electrical system includes a processor and a memory device coupled to the processor. The processor and the memory device are configured to process electrical measurement data from or derived from energy-related signals captured by at least one IED in the electrical system to identify and track at least one energy-related transient in the electrical system. The processor and the memory device are also configured to quantify an impact of the at least one energy-related transient on equipment in the electrical system. Each piece of equipment in the electrical system may have an associated energy-related stress tolerance to the at least one energy-related transient.

The processor and the memory device are additionally configured to generate one or more transient-related alarms in response to the impact of the at least one energy-related transient being near, within or above a predetermined range of the stress tolerance of the equipment. The processor and the memory device are further configured to prioritize the transient-related alarms based in part on at least one of the stress tolerance of the equipment, the stress associated with one or more transient events, and accumulated energy-related stress on the equipment. One or more actions in the electrical system make be taken by the processor and the memory device (or other systems and devices in the electrical system)-in response to the transient-related alarms to reduce energy-related stress on the equipment in the electrical system. In one embodiment, the one or more actions are taken based on at least one of the priority and severity of the transient-related alarms.

In some embodiments, the above-described system may correspond to a control system used for monitoring or controlling one or more parameters associated with the electrical system. In some embodiments, the control system may be a meter, an IED (e.g., of the at least one IED responsible for capturing the energy-related signals), programmable logic controller (PLC), on-site/head-end software (i.e., a software system), a cloud-based control system, a gateway, a system in which data is routed over the Ethernet or some other communications system, etc.

As used herein, an IED is a computational electronic device optimized to perform a particular function or set of functions. Examples of IEDs include smart utility meters, power quality meters, microprocessor relays, digital fault recorders, and other metering devices. IEDs may also be imbedded in variable speed drives (VSDs), uninterruptible power supplies (UPSs), circuit breakers, relays, transformers, or any other electrical apparatus. IEDs may be used to perform monitoring and control functions in a wide variety of installations. The installations may include utility systems, industrial facilities, warehouses, office buildings or other commercial complexes, campus facilities, computing co-location centers, data centers, power distribution networks, or any other structure, process or load that uses electrical energy. For example, where the IED is an electrical power monitoring device, it may be coupled to (or be installed in) an electrical power transmission or distribution system and configured to sense/measure and store data as electrical parameters representing operating characteristics (e.g., voltage, current, waveform distortion, power, etc.) of the electrical distribution system. These parameters and characteristics may be analyzed by a user to evaluate potential performance, reliability and/or power quality-related issues, for example. The IED may include at least a controller (which in certain IEDs can be configured to run one or more applications simultaneously, serially, or both), firmware, a memory, a communications interface, and connectors that connect the IED to external systems, devices, and/or components at any voltage level, configuration, and/or type (e.g., AC, DC). At least certain aspects of the monitoring and control functionality of an IED may be embodied in a computer program that is accessible by the IED.

In some embodiments, the term "IED" as used herein may refer to a hierarchy of IEDs operating in parallel and/or tandem. For example, an IED may correspond to a hierarchy of energy meters, power meters, and/or other types of resource meters. The hierarchy may comprise a tree-based hierarchy, such a binary tree, a tree having one or more child nodes descending from each parent node or nodes, or combinations thereof, wherein each node represents a specific IED. In some instances, the hierarchy of IEDs may share data or hardware resources and may execute shared software. It is understood that hierarchies may be non-spatial such as billing hierarchies where IEDs grouped together may be physically unrelated.

In some embodiments, the metering devices (e.g., IEDs) and equipment/loads of the above and below described systems and methods are installed, located and/or derived from different respective locations (i.e., a plurality of locations) or metering points in the electrical system. A particular IED (e.g., a second IED) may be upline (or upstream) from another IED (e.g., a third IED) in the electrical system while being downline (or downstream) from a further IED (e.g., a first IED) in the electrical system, for example.

As used herein, the terms "upline" and "downline" (also sometimes referred to as "upstream" and "downstream", respectively) are used to refer to electrical locations within an electrical system. More particularly, the electrical locations "upline" and "downline" are relative to an electrical location of an IED collecting data and providing this information. For example, in an electrical system including a plurality of IEDs, one or more IEDs may be positioned (or installed) at an electrical location that is upline relative to one or more other IEDs in the electrical system, and the one or more IEDs may be positioned (or installed) at an electrical location that is downline relative to one or more further IEDs in the electrical system. A first IED or load that is positioned on an electrical circuit upline from a second IED or load may, for example, be positioned electrically closer to an input or source of the electrical system (e.g., an electrical generator or a utility feed) than the second IED or load. Conversely, a first IED or load that is positioned on an electrical circuit downline from a second IED or load may be positioned electrically closer to an end or terminus of the electrical system than the other IED.

A first IED or load that is electrically connected in parallel (e.g., on an electrical circuit) with a second IED or load may be considered to be "electrically" upline from said second IED or load in embodiments, and vice versa. In embodiments, algorithm(s) used for determining a direction of a power quality event (i.e., upline or downline) is/are located (or stored) in the IED, cloud, on-site software, gateway, etc. As one example, the IED can record an electrical event's voltage and current phase information (e.g., by sampling the respective signals) and communicatively transmit this information to a cloud-based system. The cloud-based system may then analyze the voltage and current phase information (e.g., instantaneous, root-mean-square (rms), waveforms and/or other electrical characteristic) to determine if the source of an energy-related transient was electrically upline or downline from where the IED is electrically coupled to the electrical system (or network).

It is understood there are types of power quality events and there are certain characteristics of these types of power quality events. A power quality event may include a voltage transient, for example. Below is a table from IEEE Standard 1159-2019 (known art), which defines various categories and characteristics of power system electromagnetic phenomena.

| Categories | Typical spectral content | Typical duration | Typical voltage magnitude |
|---|---|---|---|
| 1.0 Transients | | | |
| 1.1 Impulsive | | | |
| 1.1.1 Nanosecond | 5 ns rise | <50 ns | |
| 1.1.2 Microsecond | 1 μs rise | 50 ns-1 ms | |
| 1.1.3 Millisecond | 0.1 ms rise | >1 ms | |
| 1.2 Oscillatory | | | |
| 1.2.1 Low frequency | <5 kHz | 0.3-50 ms | 0-4 pu[a] |
| 1.2.2 Medium frequency | 5-500 kHz | 20 μs | 0-8 pu |
| 1.2.3 High frequency | 0.5-5 MHz | 5 μs | 0-4 pu |
| 2.0 Short-duration root-mean-square (rms) variations | | | |
| 2.1 Instantaneous | | | |
| 2.1.1 Sag | | 0.5-30 cycles | 0.1-0.9 pu |
| 2.1.2 Swell | | 0.5-30 cycles | 1.1-1.8 pu |
| 2.2 Momentary | | | |
| 2.2.1 Interruption | | 0.5 cycles - 3 s | <0.1 pu |
| 2.2.2 Sag | | 30 cycles - 3 s | 0.1-0.9 pu |
| 2.2.3 Swell | | 30 cycles - 3 s | 1.1-1.4 pu |
| 2.2.4 Voltage Imbalance | | 30 cycles - 3 s | 2%-15% |
| 2.3 Temporary | | | |
| 2.3.1 Interruption | | >3 s-1 min | <0.1 pu |
| 2.3.2 Sag | | >3 s-1 min | 0.1-0.9 pu |
| 2.3.3 Swell | | >3 s-1 min | 1.1-1.2 pu |
| 2.3.4 Voltage Imbalance | | >3 s-1 min | 2%-15% |
| 3.0 Long duration rms variations | | | |
| 3.1 Interruption, sustained | | >1 min | 0.0 pu |
| 3.2 Undervoltages | | >1 min | 0.8-0.9 pu |
| 3.3 Overvoltages | | >1 min | 1.1-1.2 pu |
| 3.4 Current overload | | >1 min | |
| 4.0 Imbalance | | | |
| 4.1 Voltage | | steady state | 0.5-5% |
| 4.2 Current | | steady state | 1.0-3.0% |
| 5.0 Waveform distortion | | | |
| 5.1 DC offset | | steady state | 0-0.1% |
| 5.2 Harmonics | 0-9 kHz | steady state | 0-20% |
| 5.3 Interharmonics | 0-9 kHz | steady state | 0-2% |
| 5.4 Notching | | steady state | |
| 5.5 Noise | broadband | steady state | 0-1% |
| 6.0 Voltage fluctuations | <25 Hz | intermittent | 0.1-7% 0.2-2 $P_{st}$[b] |
| 7.0 Power frequency variations | | <10 s | ±0.10 Hz |

NOTE—
These terms and categories apply to power quality measurements and are not to be confused with similar terms defined in IEEE Std 1366 ™-2012 [B30] and other reliability-related standards, recommended practices, and guides.
[a]The quantity pu refers to per unit, which is dimensionless. The quantity 1.0 pu corresponds to 100%. The nominal condition is often considered to be 1.0 pu. In this table, the nominal peak value is used as the base for transients and the nominal rms value is used as the base for rms variations.
[b]Flicker severity index $P_{st}$ as defined in IEC 61000-4-15: 2010 [B17] and IEEE Std 1453 ™ [B31].

It is understood that the above table is one standards body's (IEEE in this case) way of defining/characterizing power quality events. It is understood there are other standards that define power quality categories/events as well, such as the International Electrotechnical Commission (IEC), American National Standards Institute (ANSI), etc., which may have different descriptions or power quality event types, characteristics, and terminology. It is also understood that the types and descriptions of power quality events may change over time, and the systems and methods disclosed herein are intended to be applicable to current and future types and descriptions of power quality events. In accordance with embodiments of this disclosure, power quality events (e.g., transient voltages) may additionally or alternatively be customized power quality events (e.g., defined by a user).

Transient voltages commonly originate from one of two different sources: 1) lightning events, and 2) switching events. Lightning events inject transient voltages into electrical systems by one of three mechanisms: 1) directly striking an electrical circuit, 2) indirectly striking an electrical circuit and inducing voltages and currents into the circuit, and 3) creating large earth potentials that couple into the electrical system's grounding system. Lightning strikes the earth about 6,000 times per minute, with an estimated 63 strikes/mile$^2$/year occurring in the Nashville, Tenn. area alone, for example. In North America, more than $1B worth of lightning-related insurance industry losses occur each year.

A more common occurrence to inject transient voltages into electrical systems is through switching events. Energizing large system loads (e.g., capacitor banks, transformers), energizing demand-side loads (e.g., motor), opening/closing circuits, normal load operation (e.g., controlled-rectifiers), and system faults (e.g., short circuits, arcing) are all associated with switching-related events. Switching events are inherent in the everyday operation of typical electrical systems.

With the prevalence of transient sources and the potential severity of their impact, it is important for source-side producers and demand-side consumers have tools to help evaluate and troubleshoot transient problems. Many metering system end-users are not energy experts (and certainly not transient experts); however, they are required to understand and prioritize the numerous metering system alarms that continuously inundate them.

An on-going question in the field of surge protection is how to predict the incipient failure of equipment and apparatuses. An exemplary goal of this invention is to simplify the analyses of transient impacts and to provide end-users with an "early warning system" that furnishes recommendations to install transient protection and/or inspect/test existing transient protection to ensure it is still functioning within its design specifications. It may leverage the high-end platform (HEP) metering capabilities in the ION9000T (and the CM4000T) by Schneider Electric, for example.

The ability to prioritize transient-related alarms not based merely on magnitudes and durations, but the energy/stress and accumulated energy/stress would allow end-users to focus on the consequences of transient events, for example.

This invention provides, among other features, a new energy-stress alarm (for acute and chronic transient issues), tracking of energy stress to indicate impending failure of mitigation devices (SPDs), evaluating mitigative capabilities of transient energy in existing systems and facilitating transient mitigation recommendations, and characterizing energy stress from transient events to help location and identify transient sources.

It is understood that there are many other advantages associated with the disclosed systems and methods, as will be appreciated from the discussions below.

BRIEF DESCRIPTION OF THE DRAWINGS

The foregoing features of the disclosure, as well as the disclosure itself may be more fully understood from the following detailed description of the drawings, in which.

DETAILED DESCRIPTION

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected.

For convenience, certain introductory concepts and terms used in the specification (and adopted from IEEE Standard 1159-2019) are collected here.

As used herein, the term "aperiodic event" is used to describe an electrical event that occurs non-cyclically, arbitrarily or without specific temporal regularity. For the sake of this paper, transients are considered to be aperiodic events (i.e., notching is considered as a harmonic phenomenon).

As used herein, the term "transient" is used to describe a deviation of the voltage and/or current from the nominal value with a duration typically less than 1 cycle. Sub-categories of transients include impulsive (uni-direction polarity) and oscillatory (bi-directional polarity) transients.

In embodiments, there are four general qualities that determine the impact of energy-related transient events:
1. The nature and source of the transient(s),
2. The susceptibility of the system(s), process(es) and/or load(s) to the transient(s),
3. The effect of the system(s), process(es) and/or load(s) to the transient, and
4. The cost sensitivity to this effect.

Because each facility is unique (even within homogenous market segments), it is difficult to ascertain the extent to which several (or even one) energy-related transient event(s) will impact a facility's operation. For example, it is possible for an energy-related transient event to significantly impact one facility's operation while the same energy-related transient may have little or no noticeable impact on another facility's operation. It is also possible for an energy-related transient to impact one part of a facility's electrical system differently than it does on another part of the same electrical system.

Figure 1:
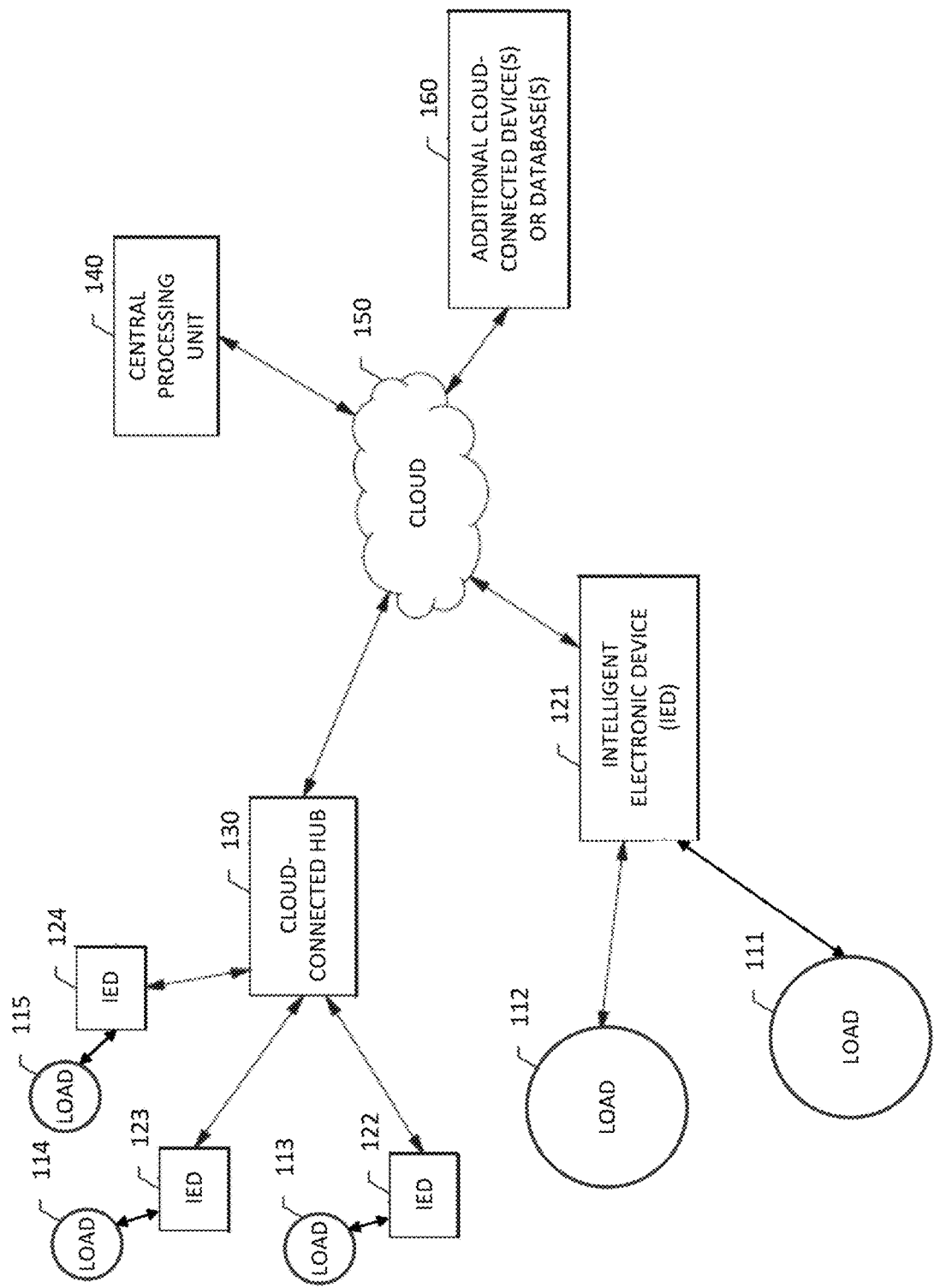
FIG. 1 shows an example electrical system in accordance with embodiments of the disclosure.

Referring to FIG. 1, an example electrical system in accordance with embodiments of the disclosure includes one or more loads (here, loads 111, 112, 113, 114, 115) (also sometimes referred to herein as "equipment" or "apparatuses") and one or more intelligent electronic devices (IEDs) (here, IEDs 121, 122, 123, 124) capable of sampling, sensing or monitoring one or more parameters (e.g., power monitoring parameters) associated with the loads. In embodiments, the loads 111, 112, 113, 114, 115 and IEDs 121, 122, 123, 124 may be installed in one or more buildings or other physical locations or they may be installed on one or more processes and/or loads within a building. The buildings may correspond, for example, to commercial, industrial or institutional buildings.

As shown in FIG. 1, the IEDs 121, 122, 123, 124 are each coupled to one or more of the loads 111, 112, 113, 114, 115 (which may be located "upline" or "downline" from the IEDs in some embodiments). The loads 111, 112, 113, 114, 115 may include, for example, machinery or apparatuses associated with a particular application (e.g., an industrial application), applications, and/or process(es). The machinery may include electrical or electronic equipment, for example. The machinery may also include the controls and/or ancillary equipment associated with the equipment.

In embodiments, the IEDs 121, 122, 123, 124 may monitor and, in some embodiments, analyze parameters (e.g., energy-related parameters) associated with the loads 111, 112, 113, 114, 115 to which they are coupled. The IEDs 121, 122, 123, 124 may also be embedded within the loads 111, 112, 113, 114, 115 in some embodiments. According to various aspects, one or more of the IEDs 121, 122, 123, 124 may be configured to monitor utility feeds, including surge protective devices (SPDs), trip units, active filters, lighting, IT equipment, motors, and/or transformers, which are some examples of loads 111, 112, 113, 114, 115, and the IEDs 121, 122, 123, 124, and may detect ground faults, voltage sags, voltage swells, momentary interruptions and oscillatory transients, as well as fan failure, temperature, arcing faults, phase-to-phase faults, shorted windings, blown fuses, and harmonic distortions, which are some example parameters that may be associated with the loads 111, 112, 113, 114, 115. The IEDs 121, 122, 123, 124 may also monitor devices, such as generators, including input/outputs (I/Os), protective relays, battery chargers, and sensors (for example, water, air, gas, steam, levels, accelerometers, flow rates, pressures, and so forth).

According to another aspect, the IEDs 121, 122, 123, 124 may detect overvoltage and undervoltage conditions (e.g., transient overvoltages), as well as other parameters such as temperature, including ambient temperature. According to a further aspect, the IEDs 121, 122, 123, 124 may provide indications of monitored parameters and detected conditions that can be used to control the loads 111, 112, 113, 114, 115 and other equipment in the electrical system in which the loads 111, 112, 113, 114 and IEDs 121, 122, 123, 124 are installed. A wide variety of other monitoring and/or control functions can be performed by the IEDs 121, 122, 123, 124, and the aspects and embodiments disclosed herein are not limited to IEDs 121, 122, 123, 124 operating according to the above-mentioned examples.

It is understood that the IEDs 121, 122, 123, 124 may take various forms and may each have an associated complexity (or set of functional capabilities and/or features). For example, IED 121 may correspond to a "basic" IED, IED 122 may correspond to an "intermediate" IED, and IED 123 may correspond to an "advanced" IED. In such embodiments, intermediate IED 122 may have more functionality (e.g., energy measurement features and/or capabilities) than basic IED 121, and advanced IED 123 may have more functionality and/or features than intermediate IED 122. For example, in embodiments IED 121 (e.g., an IED with basic capabilities and/or features) may be capable of monitoring instantaneous voltage, current energy, demand, power factor, averages values, maximum values, instantaneous power, and/or long-duration rms variations, and IED 123 (e.g., an IED with advanced capabilities) may be capable of monitoring additional parameters such as voltage transients, voltage fluctuations, frequency slew rates, harmonic power flows, and discrete harmonic components, all at higher sample rates, etc. It is understood that this example is for illustrative purposes only, and likewise in some embodiments an IED with basic capabilities may be capable of monitoring one or more of the above energy measurement parameters that are indicated as being associated with an IED with advanced capabilities. It is also understood that in some embodiments the IEDs 121, 122, 123, 124 each have independent functionality.

In the example embodiment shown, the IEDs 121, 122, 123, 124 are communicatively coupled to a central processing unit 140 via the "cloud" 150. In some embodiments, the IEDs 121, 122, 123, 124 may be directly communicatively coupled to the cloud 150, as IED 121 is in the illustrated embodiment. In other embodiments, the IEDs 121, 122, 123, 124 may be indirectly communicatively coupled to the cloud 150, for example, through an intermediate device, such as a cloud-connected hub 130 (or a gateway), as IEDs 122, 123, 124 are in the illustrated embodiment. The cloud-connected hub 130 (or the gateway) may, for example, provide the IEDs 122, 123, 124 with access to the cloud 150 and the central processing unit 140.

As used herein, the terms "cloud" and "cloud computing" are intended to refer to computing resources connected to the Internet or otherwise accessible to IEDs 121, 122, 123, 124 via a communication network, which may be a wired or wireless network, or a combination of both. The computing resources comprising the cloud 150 may be centralized in a single location, distributed throughout multiple locations, or a combination of both. A cloud computing system may divide computing tasks amongst multiple racks, blades, processors, cores, controllers, nodes or other computational units in accordance with a particular cloud system architecture or programming. Similarly, a cloud computing system may store instructions and computational information in a centralized memory or storage, or may distribute such information amongst multiple storage or memory components. The cloud system may store multiple copies of instructions and computational information in redundant storage units, such as a RAID array.

The central processing unit 140 may be an example of a cloud computing system, or cloud-connected computing system. In embodiments, the central processing unit 140 may be a server located within buildings in which the loads 111, 112, 113, 114, 115, and the IEDs 121, 122, 123, 124 are installed, or may be remotely-located cloud-based service. The central processing unit 140 may include computing functional components similar to those of the IEDs 121, 122, 123, 124 is some embodiments, but may generally possess greater numbers and/or more powerful versions of components involved in data processing, such as processors, memory, storage, interconnection mechanisms, etc. The central processing unit 140 can be configured to implement a variety of analysis techniques to identify patterns in received measurement data from the IEDs 121, 122, 123, 124, as discussed further below. The various analysis techniques discussed herein further involve the execution of one or more software functions, algorithms, instructions, applications, and parameters, which are stored on one or more sources of memory communicatively coupled to the central processing unit 140. In certain embodiments, the terms "function", "algorithm", "instruction", "application", or "parameter" may also refer to a hierarchy of functions, algorithms, instructions, applications, or parameters, respectively, operating in parallel and/or tandem. A hierarchy may comprise a tree-based hierarchy, such a binary tree, a tree having one or more child nodes descending from each parent node, or combinations thereof, wherein each node represents a specific function, algorithm, instruction, application, or parameter.

In embodiments, since the central processing unit 140 is connected to the cloud 150, it may access additional cloud-connected devices or databases 160 via the cloud 150. For example, the central processing unit 140 may access the Internet and receive information such as weather data, utility pricing data, or other data that may be useful in analyzing the measurement data received from the IEDs 121, 122, 123, 124. In embodiments, the cloud-connected devices or databases 160 may correspond to a device or database associated with one or more external data sources. Additionally, in embodiments, the cloud-connected devices or databases 160 may correspond to a user device from which a user may provide user input data. A user may view information about the IEDs 121, 122, 123, 124 (e.g., IED makes, models, types, etc.) and data collected by the IEDs 121, 122, 123, 124 (e.g., energy usage statistics) using the user device. Additionally, in embodiments the user may configure the IEDs 121, 122, 123, 124 using the user device.

In embodiments, by leveraging the cloud-connectivity and enhanced computing resources of the central processing unit 140 relative to the IEDs 121, 122, 123, 124, sophisticated analysis can be performed on data retrieved from one or more IEDs 121, 122, 123, 124, as well as on the additional sources of data discussed above, when appropriate. This analysis can be used to dynamically control one or more parameters, processes, conditions or equipment (e.g., loads) associated with the electrical system.

In embodiments, the parameters, processes, conditions or equipment are dynamically controlled by a control system associated with the electrical system. In embodiments, the control system may correspond to or include one or more of the IEDs 121, 122, 123, 124 in the electrical system, central processing unit 140 and/or other devices within or external to the electrical system.

Figure 2:
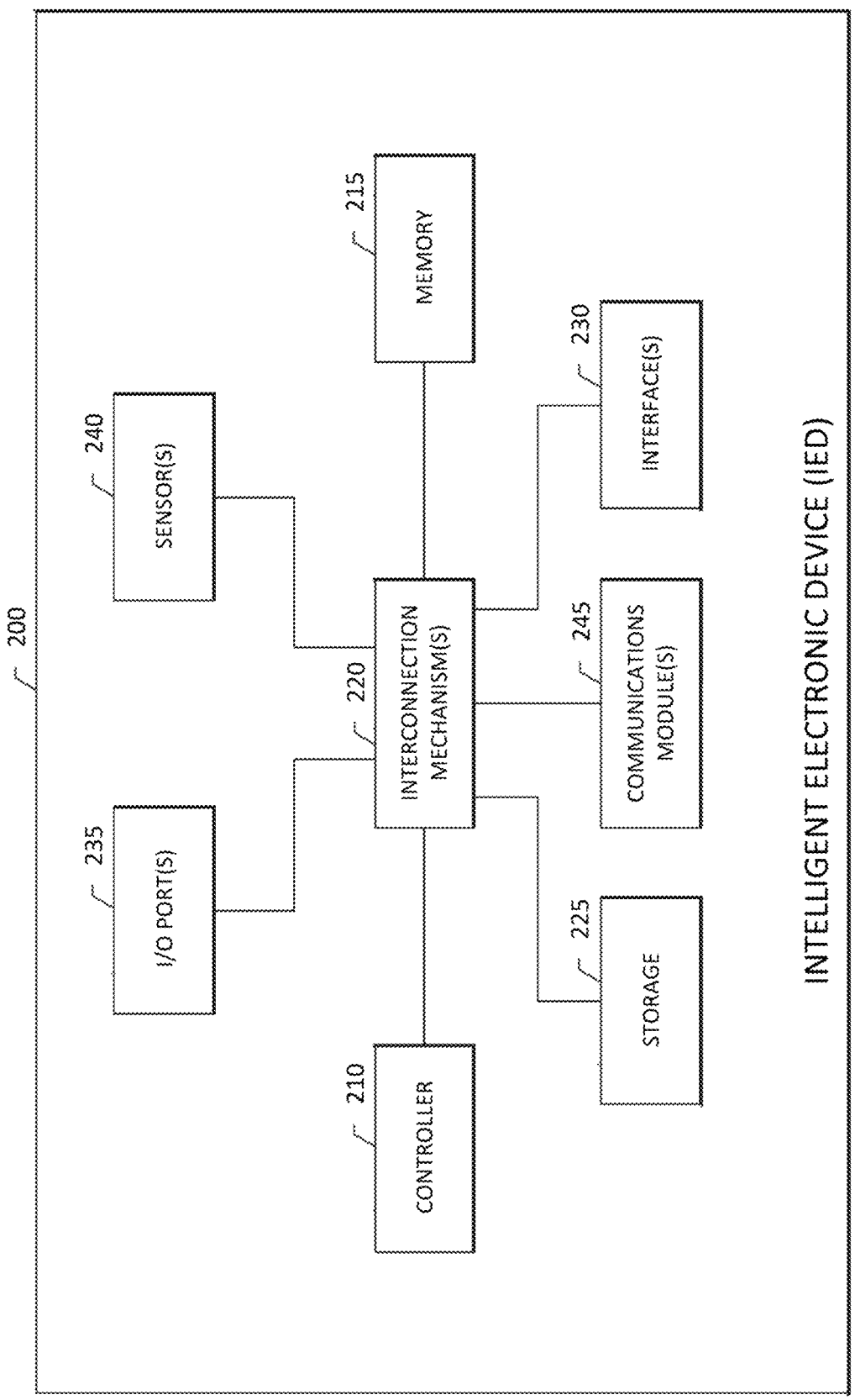
FIG. 2 shows an example intelligent electronic device (IED) that may be used in an electrical system in accordance with embodiments of the disclosure.

Referring to FIG. 2, an example IED 200 that may be suitable for use in the electrical system shown in FIG. 1, for example, includes a controller 210, a memory device 215, storage 225, and an interface 230. The IED 200 also includes an input-output (I/O) port 235, a sensor 240, a communication module 245, and an interconnection mechanism 220 for communicatively coupling two or more IED components 210-245.

The memory device 215 may include volatile memory, such as DRAM or SRAM, for example. The memory device 215 may store programs and data collected during operation of the IED 200. For example, in embodiments in which the IED 200 is configured to monitor or measure one or more electrical parameters associated with one or more loads (e.g., 111, shown in FIG. 1) in an electrical system, the memory device 215 may store the monitored electrical parameters.

The storage system 225 may include a computer readable and writeable nonvolatile recording medium, such as a disk or flash memory, in which signals are stored that define a program to be executed by the controller 210 or information to be processed by the program. The controller 210 may control transfer of data between the storage system 225 and the memory device 215 in accordance with known computing and data transfer mechanisms. In embodiments, the electrical parameters monitored or measured by the IED 200 may be stored in the storage system 225.

The I/O port 235 can be used to couple loads (e.g., 111, shown in FIG. 1) to the IED 200, and the sensor 240 can be used to monitor or measure the electrical parameters associated with the loads. The I/O port 235 can also be used to coupled external devices, such as sensor devices (e.g., temperature and/or motion sensor devices) and/or user input devices (e.g., local or remote computing devices) (not shown), to the IED 200. The external devices may be local or remote devices, for example, a gateway (or gateways). The I/O port 235 may further be coupled to one or more user input/output mechanisms, such as buttons, displays, acoustic devices, etc., to provide alerts (e.g., to display a visual alert, such as text and/or a steady or flashing light, or to provide an audio alert, such as a beep or prolonged sound) and/or to allow user interaction with the IED 200.

The communication module 245 may be configured to couple the IED 200 to one or more external communication networks or devices. These networks may be private networks within a building in which the IED 200 is installed, or public networks, such as the Internet. In embodiments, the communication module 245 may also be configured to couple the IED 200 to a cloud-connected hub (e.g., 130, shown in FIG. 1), or to a cloud-connected central processing unit (e.g., 140, shown in FIG. 1), associated with an electrical system including IED 200.

The IED controller 210 may include one or more processors that are configured to perform specified function(s) of the IED 200. The processor(s) can be a commercially available processor, such as the well-known Pentium™, Core™, or Atom™ class processors available from the Intel Corporation. Many other processors are available, including programmable logic controllers. The IED controller 210 can execute an operating system to define a computing platform on which application(s) associated with the IED 200 can run.

In embodiments, the electrical parameters monitored or measured by the IED 200 may be received at an input of the controller 210 as IED input data, and the controller 210 may process the measured electrical parameters to generate IED output data or signals at an output thereof. In embodiments, the IED output data or signals may correspond to an output of the IED 200. The IED output data or signals may be provided at I/O port(s) 235, for example. In embodiments, the IED output data or signals may be received by a cloud-connected central processing unit, for example, for further processing (e.g., to identify and track energy-related transients, as briefly discussed above), and/or by equipment (e.g., loads) to which the IED is coupled (e.g., for controlling one or more parameters associated with the equipment, as will be discussed further below). In one example, the IED 200 may include an interface 230 for displaying visualizations indicative of the IED output data or signals. The interface 230 may correspond to a graphical user interface (GUI) in embodiments.

Components of the IED 200 may be coupled together by the interconnection mechanism 220, which may include one or more busses, wiring, or other electrical connection apparatus. The interconnection mechanism 220 may enable communications (e.g., data, instructions, etc.) to be exchanged between system components of the IED 200.

It is understood that IED 200 is but one of many potential configurations of IEDs in accordance with various aspects of the disclosure. For example, IEDs in accordance with embodiments of the disclosure may include more (or fewer) components than IED 200. Additionally, in embodiments one or more components of IED 200 may be combined. For example, in embodiments memory 215 and storage 225 may be combined.

Figure 3:
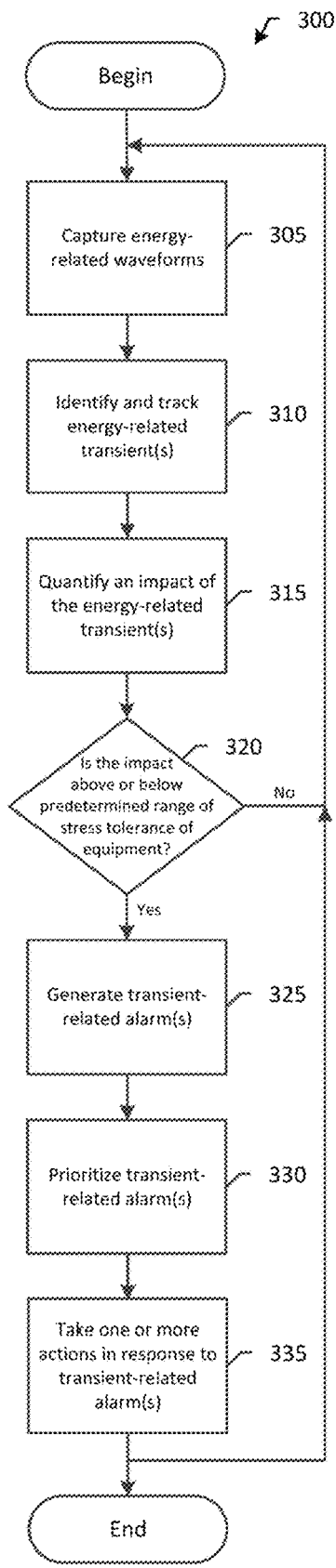
FIG. 3 is a flowchart illustrating an example implementation of a method for reducing/managing energy-related stress in an electrical system in accordance with embodiments of the disclosure.
Figure 4:
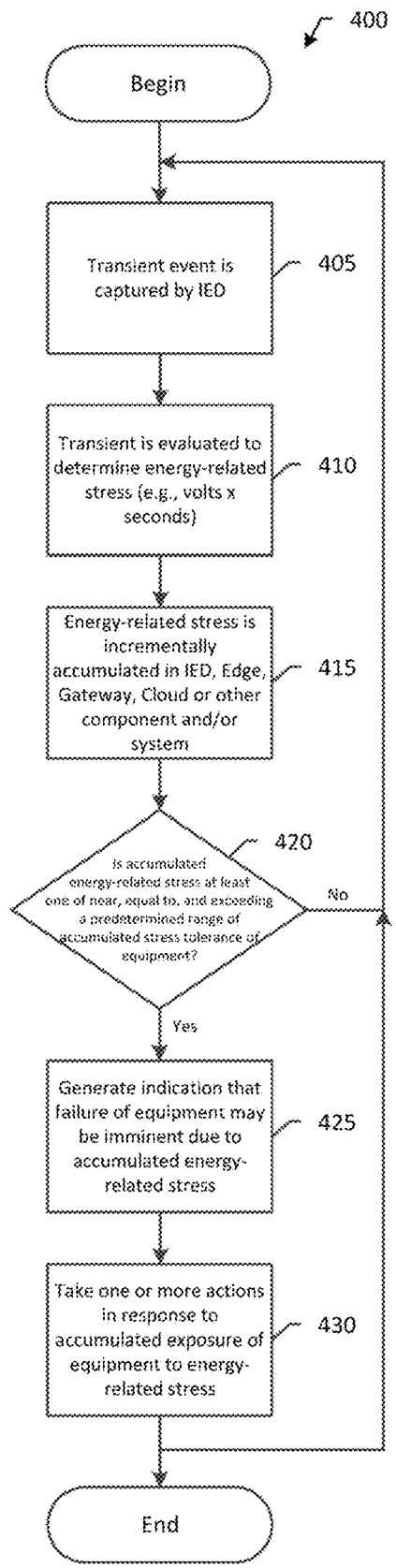
FIG. 4 is a flowchart illustrating another example implementation of a method for reducing/managing energy-related stress in an electrical system in accordance with embodiments of the disclosure.

Referring to FIGS. 3 and 4, several flowcharts (or flow diagrams) are shown to illustrate various methods (here, methods 300, 400) of the disclosure for reducing/managing energy-related stress in an electrical system. Rectangular elements (typified by element 305 in FIG. 3), as may be referred to herein as "processing blocks," may represent computer software and/or IED algorithm instructions or groups of instructions. Diamond shaped elements (typified by element 320 in FIG. 3), as may be referred to herein as "decision blocks," represent computer software and/or IED algorithm instructions, or groups of instructions, which affect the execution of the computer software and/or IED algorithm instructions represented by the processing blocks. The processing blocks and decision blocks (and other blocks shown) can represent steps performed by functionally equivalent circuits such as a digital signal processor circuit or an application specific integrated circuit (ASIC).

The flowcharts do not depict the syntax of any particular programming language. Rather, the flowcharts illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously and vice versa. It will also be understood that various features from the flowcharts described below may be combined in some embodiments. Thus, unless otherwise stated, features from one of the flowcharts described below may be combined with features of other ones of the flowcharts described below, for example, to capture the various advantages and aspects of systems and methods associated with automatically categorizing disturbances in an electrical system sought to be protected by this disclosure. It is also understood that various features from the flowcharts described below may be separated in some embodiments. For example, while the flowcharts illustrated in FIGS. 3 and 4 are shown having many blocks, in some embodiments the illustrated method shown by these flowcharts may include fewer blocks or steps.

Referring to FIG. 3, a flowchart illustrates an example method 300 for reducing and/or managing energy-related stress in an electrical system. Method 300 may be implemented, for example, on a processor of at least one IED (e.g., 121, shown in FIG. 1) and/or remote from the at least IED, for example, in at least one of: a cloud-based system, on-site/edge software, a gateway, or another head-end system.

As illustrated in FIG. 3, the method 300 begins at block 305, where energy-related signals (or waveforms) are measured and data is captured, collected, stored, etc. by at least one IED (and/or control system) in the electrical system. The at least one IED may be installed or located, for example, at a respective metering point of a plurality of metering points in the electrical system. In some embodiments, the at least one IED may be coupled to one or more loads/equipment/apparatuses in the electrical system, and the energy-related signals measured may be associated with the loads to which the at least one IED is coupled.

The energy-related signals may include, for example, at least one of: a voltage signal, a current signal, and a derived energy-related value. In some embodiments, the derived energy-related value includes at least one of: a calculated, derived, developed, interpolated, extrapolated, evaluated, and otherwise determined additional energy-related value from the at least one of the voltage signal and the current signal. It is understood that many other derived energy-related value(s) are possible, for example, as discussed in the Summary section of this disclosure.

At block 310, electrical measurement data from, or derived from, the energy-related signals (e.g., voltage and/or current signals) is processed to identify and track at least one energy-related transient in the electrical system. In some embodiments, the at least one energy-related transient includes at least one of a voltage transient and a current transient. The at least one energy-related transient may, for example, be tracked over a predetermined time period and data associated with the at least one energy-related transient may be stored for that predetermined time period. In some embodiments, the predetermined time period is a user-configured time period. More particularly, the user-configured time period may correspond to a time period configured by an end-user or services team (e.g., via a mobile device), or prescribed by an equipment manufacturer. As each phase/energy path is "stressed" with voltage transient events over time, individual and accumulated energy associated with these events may be tracked, for example. It is understood that there are many different ways to "track" energy-related transients. For example, the accumulation of transient-related activity may be tracked by location, magnitude, duration, energy content frequency content, and so forth. These may also be tracked by individual event and/or by accumulating two or more individual events together. For example, the measured or calculated energy from multiple events may be added together to determine the accumulated transient stress at an IED's particular location. Additionally, one or more individual transient characteristics between to IED locations may be "interpolated" and this information may be tracked over time. "Interpolation" of transient characteristics may occur in the quantification step (e.g., at block 315, as will be discussed below) in some embodiments.

At block 315, an impact of the at least one energy-related transient on equipment in the electrical system is quantified. In some embodiments, quantifying the impact of the at least one energy-related transient includes classifying the effects of the at least one energy-related transient on the equipment. For example, the effects of the at least one energy-related transient may be classified as at least one of: an intermittent interruption, a chronic degradation, a latent failure, and a catastrophic failure.

Intermittent interruptions may occur, for example, when a transient event is injected into a data or control network, resulting in lost or corrupted data. This may result in a load or device locking up, tripping off, or operating improperly. Factors that influence a transient's ability to disturb a load include design and operating speed of semiconductors, system filters, grounding configuration, susceptibility to electromagnetic interference (EMI) and radio frequency interference (RFI), and the configuration of the data or control cable.

Chronic degradation may occur, for example, when repetitive transient events diminish the integrity of an exposed component (or components). As is known, equipment generally has an associated stress tolerance to energy-related transients. Over time, however, generally days, weeks, or even months, the cumulative effect of energy-related transients (e.g., transient voltages) may result in the eventual inoperability of the vulnerable component. Because the energy-related transients are frequent and relatively consistent in this case, locating their source is possible.

Latent failures are similar to chronic degradation, except that they are precipitated by a significant transient event that damages components, but not to the point that the component cannot perform its intended function. Over a period of time—again, days, weeks, or even months—the ordinary stresses due to normal operation will ultimately result in the component's inoperability. This type of mode is more difficult to troubleshoot because the root cause of the failure may have occurred at an indeterminate time in the past.

Catastrophic failures due to transient voltages are somewhat obvious, as the affected component will immediately cease to operate, and damage may be visible. In this case, the transient's voltage peak magnitude or rate of rise exceeds the rated threshold of the component in such a manner as to create a permanent open circuit or short circuit within the component. The odds of correlating the component failure with a power system disturbance are usually better with this type of event.

As illustrated above, in accordance with embodiments of this disclosure the impact and classification of the at least one energy-related transient may be based on the nature and source of the at least one energy-related transient and/or the susceptibility of the equipment to the at least one energy-related transient. In accordance with embodiments of this disclosure, the impact and classification of the at least one energy-related transient may additionally or alternatively be based on the effect of the equipment or system on the at least one energy-related transient and/or the cost sensitivity of a business's operation and/or infrastructure to the at least one energy-related transient. For example, in some cases the equipment and/or infrastructure associated with the equipment may attenuate or exacerbate the at least one energy-related transient (i.e., have an effect on the at least one energy-related transient). In these cases, this effect may be used to classify the at least one energy-related transient. In some cases, the at least one energy-related transient may also have monetary impact to a business's operation and/or infrastructure (and reflect in the cost sensitivity of a business's operation and/or infrastructure to the at least one energy-related transient). In these cases, the monetary impact may be used to classify the at least one energy-related transient.

It is understood that there are many different ways to classify energy-related transients in accordance with embodiments of this disclosure. Accordingly, it is understood that the above-discussed classifications (e.g., intermittent interruptions, chronic degradations, latent failures, and catastrophic failures) and classification factors are but a few of many possible ways in which the at least one energy-related transient may be classified. The table from IEEE Standard 1159-2019, for example, as provided in the summary section of this disclosure, classifies energy-related transients by type (impulsive and oscillatory) and by duration/frequency (low/medium/high), etc. However, it is understood that energy-related transients may also be classified as impactful/not impactful to the load, for example, based on load changes associated with a transient event (like we did with voltage sags in the other applications), etc.

At block 320, it is determined if the impact of the at least one energy-related transient is above or below a predetermined range of stress tolerance of the equipment. As discussed above, equipment generally has an associated stress tolerance to energy-related transients. The stress tolerance of the equipment, and the accumulated energy-related stress on the equipment, may be indicative of end of life (EOL) "early warning" of the equipment. As is known, equipment may fail (and reach its EOL) due to chronic degradation, latent failure and/or catastrophic failure. In embodiments in which the EOL of the equipment is not known (e.g., for surge devices), the stress tolerance of the equipment and the accumulated energy-related stress on the equipment, may be used to predict the EOL of the equipment in accordance with embodiments of this disclosure. For example, in embodiments in which the equipment includes at least one surge device not having a defined accumulated stress life, the EOL of the at least one surge device may be predicted based on EOL data for similar products/equipment using the accumulated energy-related stress data on the at least one surge device. The EOL of the equipment (e.g., surge device) may be predicted using mean time to failure (MTTF), for example. The MTTF may be based on an evaluation of at least energy-related stress, for example. In some embodiments, the EOL or near/approximate EOL of the equipment may be communicated to an end-user, equipment manufacturer, and/or services team, for example. This will allow the end-user to plan an outage to resolve the issue or replace the equipment accordingly.

With respect to surge devices, as is known these devices are used to mitigate voltage transients by 1) providing a low impedance path for current to flow during a voltage transient event, and 2) absorbing and diverting extraneous currents associated with a voltage transient to ground in order to protect loads/equipment from the effects of a voltage transient (e.g., surge). These devices have a limited operational life, and over time will fail as they are exposed to surge energy (e.g., the product of the transient event's peak amplitude squared and the duration of the transient voltage event) and/or energy stress (e.g., area of the transient voltage outside the nominal voltage signal). In some cases where older MOV technologies are used, the device may fail as a short-circuit resulting in a faulted circuit. While newer versions of surge devices have integrated fuses that open after this failure mode, it still creates the issue of not knowing when a failure occurs and the system is left unprotected (which is one example issue this disclosure addresses). For the sake of this disclosure, surge devices may include: surge arrestors, lightning arrestors, surge suppressors, transient voltage surge suppressors, etc. Equipment such as surge devices (for example) have a fixed life expectancy based on their exposure to said voltage transient events.

Returning now to block 320, if it is determined that the impact of the at least one energy-related transient falls outside of the predetermined range of stress tolerance of the equipment (which may be indicative of incipient failure of the equipment, for example), the method proceeds to block 325. Alternatively, if is determined that the impact of the at least one energy-related transient does not fall outside of the predetermined range of stress tolerance of the equipment, the method may either return to block 305 (for further capturing and processing of energy-related signals) or end.

For example, in embodiments in which it is desirable to continuously (or semi-continuously) capture energy-related signals and to dynamically identify and track energy-related transients (and generate transient-related alarms, as will be discussed below), the method may return to block 305. Alternatively, in embodiments in which it is desirable to characterize (and respond to) energy-related transients identified in a single set of captured energy-related signals, the method may end.

At block 325, one or more transient-related alarms may be generated in response to the impact of the at least one energy-related transient being near, within or above the predetermined range of the stress tolerance of the equipment, for example, for one or more phases or circuits (or residual/calculated paths). The transient-related alarms may, for example, inform an end-user, equipment manufacturer, and/or services team when the equipment nears and/or exceeds a pre-determined threshold of voltage stress energy. These alarms may be used for single events on one or more phases (or energy paths) OR for accumulated events on/through one or more phases (or energy paths).

At block 330, which is optional in some embodiments, the transient-related alarms generated at block 325 (and, in some cases, previously generated transient-related alarms) are prioritized. In accordance with some embodiments, the transient-related alarms are prioritized based in part on at least one of the stress tolerance of the equipment, the stress associated with one or more transient events, and accumulated energy-related stress on the equipment. In embodiments in which the method 300 has been executed one or more times, it is possible that one or more previously generated transient-related alarms may exist. In these embodiments, the prioritization occurring at block 330 may consider (and reprioritize) these previously generated transient-related alarms. As one example, the prioritization may consider the age, severity and/or cost(s) associated with these previously generated transient-related alarms, along with the severity and/or costs associated with newly generated transient-related alarms. The transient-related alarms may also be prioritized based on the importance of the system where the transient is occurring (or seems to be occurring). Additionally, the transient-related alarms can be prioritized based on the impact to the system if the surge device fails and the load equipment becomes directly exposed to the energy-related stress.

At block 335, one or more actions may be taken in response to the transient-related alarms generated at block 325, for example, based on the prioritization of the alarms at block 330. For example, in some embodiments taking the one or more actions includes identifying at least one means to reduce the energy-related stress on the equipment in the electrical system, selecting one or more of the at least one means to reduce the energy-related stress based on at least one of the priority and severity of the transient-related alarms, and applying the selected one or more of the at least one means to reduce the energy-related stress. In some embodiments, the one or more of the at least one means to reduce the energy-related stress includes adding at least one transient mitigative device. The at least one transient mitigative device may include, for example, at least one of: a surge arrester, a lightning arrestor, a surge suppressor, and a transient voltage surge suppressor.

In some embodiments, the one or more of the at least one means to reduce the energy-related stress may be further selected based on an expected ability of the one or more of the at least one means to reduce at least one of the magnitude and duration of the at least one energy-related transient in the electrical system. Additionally, in some embodiments the one or more of the at least one means to reduce the energy-related stress may be further selected based on economic costs associated with acquiring and/or applying the one or more of the at least one means to reduce the energy-related stress. It may be based on the importance of protecting a particular system, sub-system, equipment, or component from energy transients, for example.

In some embodiments, the actions taken in response to the transient-related alarms may also include resolving the issue and/or installing/replacing/removing/supplementing the mitigation device(s) (i.e., the at least one means to reduce the energy-related stress). The exposure to voltage stress due to transient events over time may indicate the need to purchase and install higher quality or more resilient surge protective devices (SPDs), or mitigate the problem(s) producing the transient events if possible. For example, indicating a suggested size/capability of SPDs based on acute and chronic voltage transient exposure. One example type of SPD is a metal-oxide varistor (MOV) SPD. As is known, MOV SPDs are nonlinear, voltage dependent components that provide effective transient mitigation capabilities. When high voltage events (e.g., voltage transients) are applied to a MOV's input terminal(s), its impedance transitions from effectively being an open circuit to becoming highly conductive. This provides a path for the transient energy to flow through the MOV to neutral and/or ground. "Shunting" the transient energy in this way helps protect nearby electrical equipment/infrastructure (e.g., conductors, transformers, loads, components, etc.) from absorbing the transient energy and becoming damaged. While MOVs are a proven method for protecting electrical equipment/infrastructure from transient voltages, MOVs may also be adversely impacted by transient events. If an MOV is electrically stressed beyond its rating (e.g., exposure to chronic or acute transient voltages), it may fail in a short-circuit failure mode. It is recommended current-limiting fuses be installed with MOVs to ensure the MOV (and system) are protected in the event the MOV fails as a short circuit.

In accordance with some embodiments of this disclosure, locations of the above-discussed SPDs (MOV or otherwise) may be prioritized and/or determined based on measured energy stress levels from a system vantage. When a piece of equipment is replaced, this invention allows the end-user (et al.) to reset the accumulated energy stress level for the at least one phase (or path) where said equipment was replaced. This will reset the energy stress value to zero for the new equipment that was installed. Alternatively, this invention may allow both the original accumulated energy stress and a second accumulated energy stress to be tracked simultaneously, the first being a lifetime accumulation and the second being a discrete accumulation of energy stress experienced by the new equipment. The latter is useful and relates to the new equipment life, and the former is useful and generally relates to non-replaced equipment and infrastructure (e.g., conductors, transformers, etc.). For the purposes of this application, there may be as many of these accumulated energy stress counters as needed. For example, two discrete SPDs may be replaced at different times. The lifetime exposure and/or accumulation values for each of the SPDs may be different from each other.

Other examples of actions that may be taken in response to the transient-related alarms include controlling at least one component (e.g., piece of equipment) in the electrical system, and communicating the transient-related alarms to an end-user, equipment manufacturer, and/or services team. For example, at least one parameter (e.g., on-off power state)

associated with the at least one component may be controlled or adjusted in response to the transient-related alarms (e.g., to prevent or reduce damage to electrical system equipment). The parameter may be controlled, for example, in response to a control signal received from an IED of the at least one IED and/or to a control signal received from a control system, for example. The control system may be communicatively coupled to the at least one IED, and/or to a cloud-based system, on-site software, a gateway, and another head-end/edge system associated with the electrical system, for example.

As discussed above, in some embodiments the transient-related alarms may be communicated to an end-user, equipment manufacturer, and/or services team. In accordance with embodiments of this disclosure, the communication may include, for example, at least one of: a report, a text, an email, audibly, and an interface of a screen/display (e.g., a display device of a computing device or system associated with the electrical system). The report, text, etc. may present the priority and severity of the transient-related alarms. Additionally, the report, text, etc. may provide actionable recommendations for responding to the transient-related alarms. The transient-related alarms inform an end-user, equipment manufacturer, and/or services team when the equipment nears and/or exceeds a pre-determined threshold of voltage stress energy, for example.

Subsequent to block 335, the method may end in some embodiments. In other embodiments, the method may return to block 305 and repeat again (for substantially the same reasons discussed above in connection with block 305). In some embodiments in which the method ends after block 335, the method may be initiated again in response to user input and/or a control signal, for example.

It is understood that method 300 may include one or more additional blocks or steps in some embodiments. For example, in some embodiments method 300 may include evaluating/correlating/trending transient energy-stress levels with the transient voltage event's (or other transient-event's) characteristics to troubleshoot transient problems. For example, evaluating/correlating/trending frequency components associated with transient voltage events may be useful to identify the source and location of the transient voltage events. The existence of high frequency components may indicate a local source because conductors and transformers inherently act as low-pass filters for higher frequencies. As the transient voltage source is moved further away from the metering device, the higher frequencies are attenuated. In this case, transient voltage events generally exhibiting primarily lower frequency components will indicate the source is likely further from the meter capturing the data.

As is known, transient source-types may have unique energy stress characteristics such as shape, amplitude, duration, rate of rise, rate of decay, associated frequency components, periodicity, and shape to name a few. Correlating transient voltage characteristics using multiple linear regression techniques can help isolate and identify transient sources in accordance with embodiments of this disclosure. A well-known example is motor starter contactor bouncing. Motor starters are important component in operating motors. Bouncing contacts shorten the life of the starter and can directly or indirectly impact the motor. When a motor's magnetic contactor bounces, it creates arcing (transients) that damage the contact surfaces. Failure of the contactors may result in single-phasing a motor or fusing the contacts together so the contactors will no longer open. The contactor bouncing can also stress the initial windings of the motor's stator due to the transients created when they bounce.

Another aspect of the invention is to identify the unique characteristics of contactor bouncing so that remedial steps can be taken to mitigate them. Other example aspects of this invention are described below in connection with method 400, for example.

Referring to FIG. 4, a flowchart illustrates another example method 400 for reducing/managing energy-related stress in an electrical system. Similar to method 300, method 400 may be implemented, for example, on a processor of at least one IED (e.g., 121, shown in FIG. 1) and/or remote from the at least IED, for example, in at least one of: a cloud-based system, on-site software/edge, a gateway, or another head-end system.

As illustrated in FIG. 4, the method 400 begins at block 405, where a transient event is captured by at least one IED in the electrical system. In some embodiments, the transient event is captured from energy-related signals (or waveforms) measured by the at least one IED. The at least one IED may be installed or located, for example, at a respective metering point of a plurality of metering points in the electrical system. In some embodiments, the at least one IED may be coupled to one or more loads/equipment in the electrical system, and the energy-related signals measured may be associated with the loads to which the at least one IED is coupled.

At block 410, the transient event captured at block 405 is evaluated to determine energy-related stress in the electrical system due to the transient event. For example, as previously discussed in this disclosure, a transient event (or energy-related transient) may impact equipment in the electrical system, for example, resulting in an intermittent interruption, chronic degradation, latent failure and/or catastrophic failure of the equipment and/or associated systems, processes, etc. in the electrical system. In accordance with embodiments of this disclosure, similar to block 315 of method 300, the energy-related stress may be determined, for example, determined based on at least one of: the nature and/or source of the at least one energy-related transient, the susceptibility of the equipment to the at least one energy-related transient, the effect of the equipment on the at least one energy-related transient, and the cost sensitivity of a business's operation and/or infrastructure to the at least one energy-related transient. In embodiments in which the energy-related transient is a voltage transient, the energy-related stress may be quantified in volts-second, for example.

At block 415, the energy-related stress may be incrementally accumulated in at least one of the IED, edge computing device, gateway, cloud or other component and/or system, and data associated with the energy-related stress and/or the transient may be stored or otherwise recorded (e.g., in the IED, edge computing device, gateway, cloud or other component and/or system).

At block 420, it is determined if the accumulated energy-related stress is at least one of near, equal to, or exceeding a predetermined range of accumulated stress tolerance of the equipment. As discussed above, equipment generally has an associated stress tolerance to energy-related transients. If it is determined that the accumulated energy-related stress is at least one of near, equal to, or exceeding the predetermined range of accumulated stress tolerance of the equipment (which may be indicative of incipient failure of the equipment, for example), the method proceeds to block 425. Alternatively, if is determined that the accumulated energy-related stress is not at least one of near, equal to, or exceeding the predetermined range of accumulated stress tolerance of the equipment, the method may either return to block 405 (for further measuring of energy-related signals to capture transient events) or end.

At block 425, in response to it having been determined that the accumulated energy-related stress is at least one of near, equal to, or exceeding the predetermined range of accumulated stress tolerance of the equipment, an indication may be generated, for example, to alert an end-user and/or operator that failure of equipment may be imminent due to the accumulated energy-related stress. The indication may, for example, specify the type and location of the equipment in the electrical system, and the expected EOL of the equipment (i.e., provide an "early warning" of failure). In accordance with embodiments of this disclosure, the indication may take a variety of forms, for example, a report, a text, an email, audibly, and an interface of a screen/display.

At block 430, one or more actions are taken in response to the accumulated exposure of the equipment to the energy-related stress. For example, one or more actions may be taken in the electrical system to prevent the equipment from accumulating further energy-related stress. As one example, the source(s) of the energy-related stress may be isolated and potentially removed from the electrical system (e.g., automatically, semi-automatically or manually) to prevent the equipment from accumulating further energy-related stress.

One or more actions may also be taken at block 430 to repair and/or replace the equipment. An end-user may, for example, plan an outage to resolve the issue or replace the equipment accordingly. In some embodiments, recommendation(s) may be provided by the system(s) or device(s) on which the method is implemented, for example, to reduce downtime and impacts of the outage. For example, the system(s) or device(s) may determine and specify particular time periods for which a planned outage would least impact operation of the equipment and/or systems and/or process (es) associated with the equipment.

Subsequent to block 430, the method may end in some embodiments. In other embodiments, the method may return to block 405 and repeat again (e.g., for dynamic transient event detection and response). In some embodiments in which the method ends after block 430, the method may be initiated again in response to user input and/or a control signal, for example. The control signal may be received, for example, from a control system or other system(s) or device (s) on which the method is implemented. Similar to method 300 discussed above in connection with FIG. 3, it is understood that method 400 may include one or more additional blocks or steps in some embodiments.

Because transient voltage events and other types of events causing energy-related stress can potentially cause significant amounts of damage to a facility's equipment and impact their operation, features to evaluate their impact and effects are crucial. This invention may potentially lead to new service opportunities based on accumulated data showing the need to take an action. Working in conjunction with Schneider Electric's SPD product offering(s), for example, the various differentiating features provided by this invention can produce leads for engineering studies and services, new products, additional product sales, and ultimately a stronger energy partnership with customers.

Figure 5:
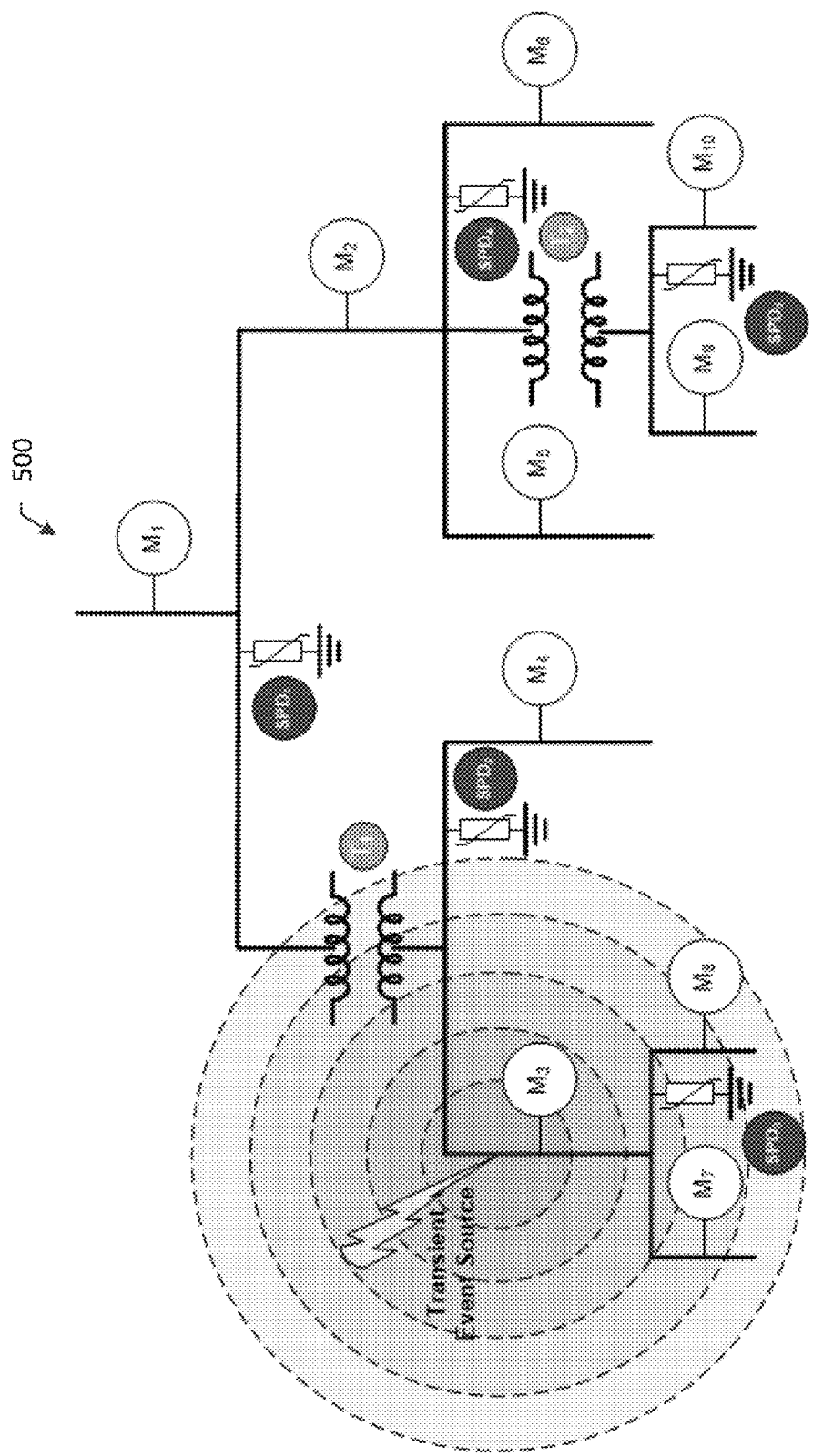
FIG. 5 shows an example electrical system subject to a transient event and for which the systems and methods disclosed herein may be found suitable for reducing/managing energy-related stress in the electrical system due to the transient event.

Referring to FIG. 5, shown is an example representation of an electrical system 500 that has been subject to a transient event and for which the systems and methods disclosed herein may be found suitable for reducing/managing energy-related stress in the electrical system caused by the transient event. In accordance with some embodiments of this disclosure, the electrical system 500 is representative of an example implementation of electrical system 100 shown in FIG. 1. As illustrated, the electrical system 500 includes a plurality of metering devices ($M_1$, $M_2$, $M_3$, etc.), a plurality of surge protective devices ($SPD_1$, $SPD_2$, $SPD_3$, etc.) and a plurality of step-down transformers ($T_1$, $T_2$). In the illustrated embodiment, the SPDs are provided as an MOV-type SPDs, which experience an inversely proportional relationship between the voltage and impedance of the device (e.g., as the voltage increases, the impedance decreases), as described in more detail in connection with FIG. 3. With the application of the voltage transient to the MOVs' terminals, the impedance of the MOVs significantly decrease to allow the energy from the transient event to be shunted to ground through the MOVs. Dispersing multiple MOVs across the electrical system, as shown in FIG. 5, helps to more effectively dissipate the energy from the transient event as it propagates throughout the system.

The propagation of a transient event is analogous to dropping a pebble into a pond with the highest magnitude occurring at the point where energy is injected (here, proximate to metering device $M_3$). The transient's energy will dissipate due to the inherent inductance of the electrical system (e.g., conductors, transformers, loads, etc.) creating a voltage gradient within the electrical system; becoming less severe as the distance increases from the transient's event source (as indicated with the concentric circles around the transient event source). Systems and methods for determining where a transient event occurs in a known hierarchy are described, for example, in U.S. Pat. No. 7,526,391, entitled "Method and Apparatus to Evaluate Transient Characteristics in an Electrical Power System," which patent is assigned to the same assignee as the present disclosure and is incorporated by reference herein in its entirety.

Returning now to FIG. 5, in the illustrated embodiment transformer #1 (i.e., $T_1$) will also significantly impede the transient's energy passing upstream (i.e., in addition to the dissipation provided by the MOVs), albeit with stress induced to the transformer's insulation. As is known, stress to the transformer's insulation, and insulation of other electrical devices in an electrical system, may lead to breakdown of the dielectric material and eventual failure of the electrical devices.

Figure 6:
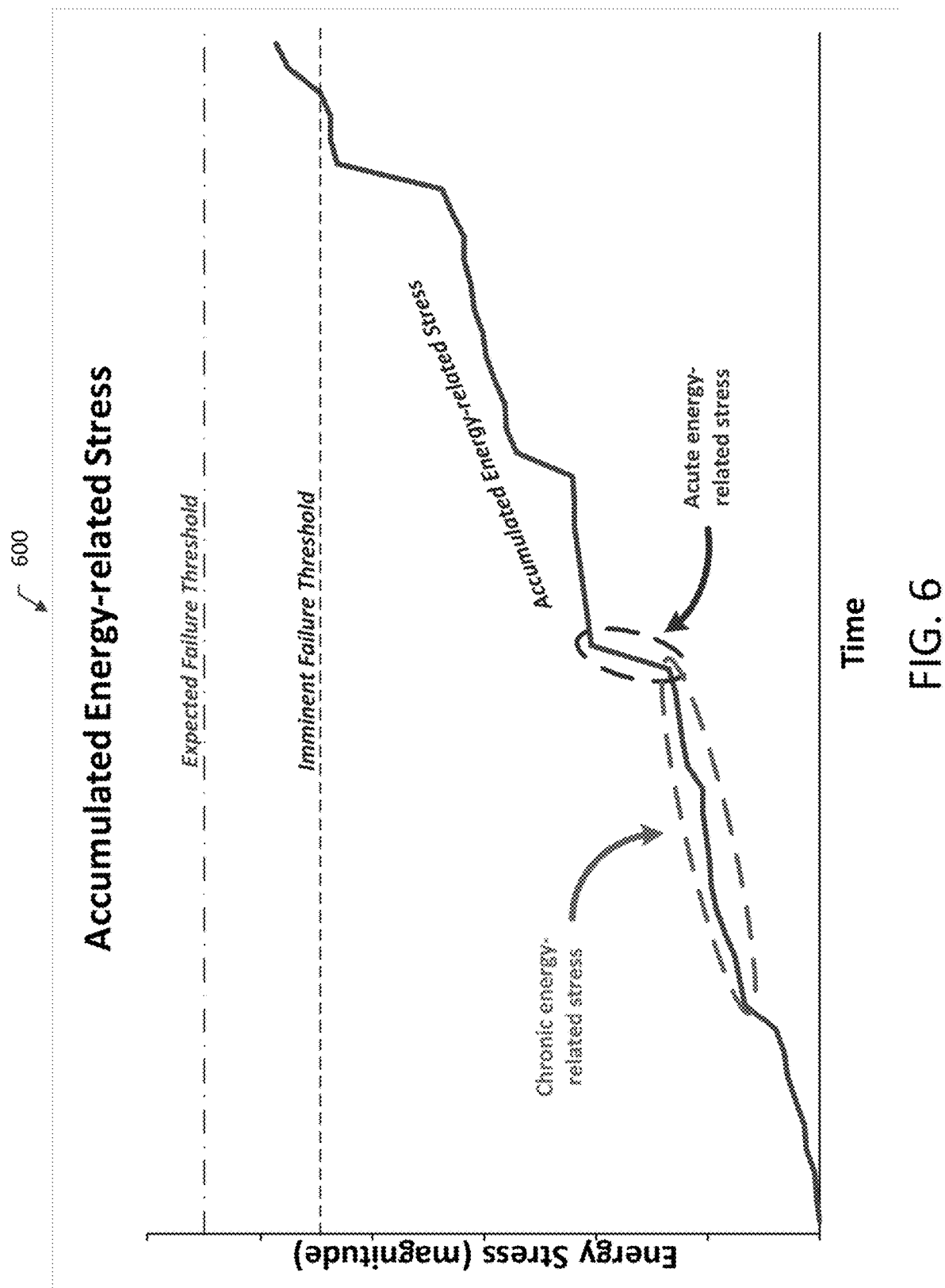
FIG. 6 shows the accumulation of energy-related stress over a period of time for an example component of or associated with an electrical system, such as the electrical systems shown in FIGS. 1 and 5, for example.

Referring to FIG. 6, a graph 600 illustrates the accumulation of energy-related stress over a period of time, particularly the relationship between the magnitude of energy-related stress, time and failure thresholds. In accordance with embodiments of this disclosure, the graph 600 may be for a piece of equipment (e.g., motor stator, VSD), a component in an electrical system's infrastructure (e.g., a conductor), an IED (e.g., metering device), a protective device (e.g., SPD) or some other element and/or aspect of an electrical system, such as the electrical systems shown in FIGS. 1 and/or 5. In the illustrated example, the element and/or aspect is experiencing chronic/recurring exposure to energy-related stress (e.g., transient voltage events). Over time the element and/or aspect experiencing the exposure to this energy-related stress degrades. The rate of degradation is dependent on a number of factors including, but not limited to, design of the element/aspect, characteristics of the exposure to the energy-related stress (e.g., magnitude, duration, frequency, etc.), location within the electrical system, other elements/aspects of the surrounding electrical system (and their respective characteristics), placement of SPDs, and so forth.

As illustrated in the graph 600, over time (generally days, weeks, months, or even years), the cumulative effect of energy-related stress may result in the eventual failure of the element/aspect. In accordance with embodiments of this disclosure, information relating to the accumulated energy-related stress associated with the element/component (e.g., as collected at blocks 405, 410, 415, etc. of method 400, shown in FIG. 4) may be analyzed to determine if failure of the element/component is expected and/or imminent. As used herein, the term "expected failure" is used to describe a failure that has a high probability of occurring soon. Additionally, as used herein, the term "imminent failure" is used to describe a failure that has a reasonable probability of occurring soon. This is not to say the failure will take place soon or that a failure may not have already occurred, but that a failure may occur. Both the imminent failure threshold and expected failure threshold may be determined in a number of ways including, but not limited to:

derived from the accumulated energy-related stress exposure of a device(s)/component(s)/element(s)/aspect(s) expected lifetime accumulation failure threshold, derived from the life expectancy of a device(s)/component(s)/element(s)/aspects(s), determined from the manufacturer's recommendations for said device(s)/component(s)/element(s)/aspect(s), based on operational experience and/or requirements, arbitrarily determined, or some other practicable means.

Derived, determined, based on, arbitrarily determined, etc. may be obtained using statistical methods (e.g., a predetermined number of standard deviations, failure rate using normal distribution, etc.), mean time between failure (MTBF) data, failure rate data, other manufacturer's data, design criteria, placement(s), or any other feasible approach. Each and any approach (and/or threshold) may be dynamically adjusted based on one or more internal and/or external circumstances and/or parameters. For example, one approach may be to determine the imminent and expected failure thresholds using a simple evaluation of the accumulated energy-related stress over the life of a device/component/element/aspect. Another approach may be to determine and/or derive the imminent and expected failure thresholds using the periodicity and/or magnitude or the transient events. A third approach may be a combination of the two previous examples, and so forth. The expected failure threshold may be derived (in part or in its entirety) from a determined imminent failure threshold and vice versa. For example, if an expected failure value or threshold of a device(s)/component(s)/element(s)/system(s)/process(s)/aspect(s) has been determined, the imminent failure value or threshold of said device(s)/component(s)/element(s)/system(s)/process(s)/aspect(s) may be chosen to be some percentage of the expected failure value or threshold (e.g., setting the imminent failure threshold to 90% of the expected failure threshold).

Figure 7:
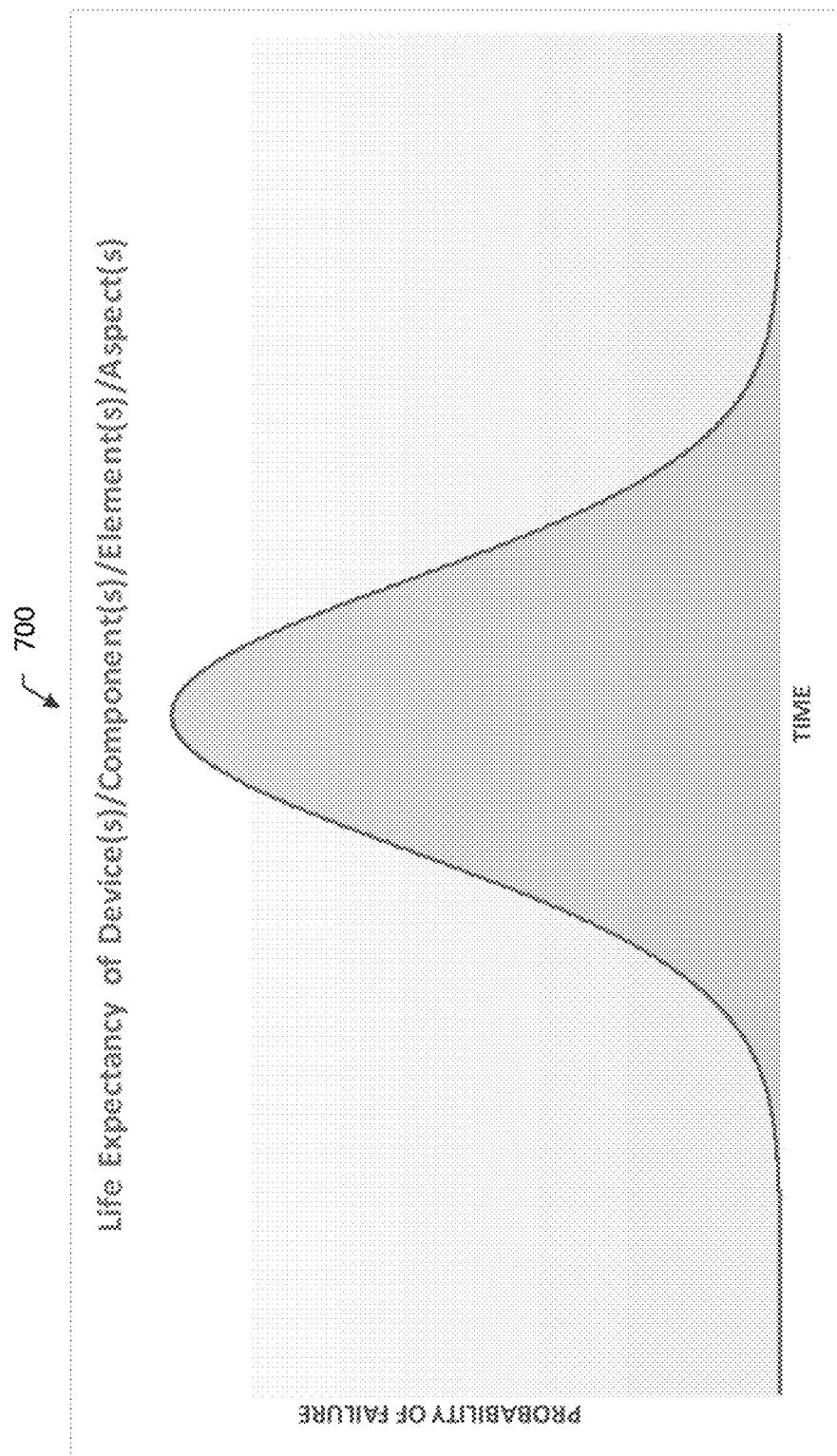
FIG. 7 shows the life expectancy of an example component of or associated with an electrical system in relation to time of exposure of the example component to energy-related stress.

As discussed above in connection with FIG. 4, for example, in response to determining that accumulated energy-related stress (e.g., due to a transient event) is at least one of near, equal to, and exceeding a predetermined range of accumulated stress tolerance of equipment, an indication may be generated (e.g., at block 425) to indicate that failure of the equipment may be imminent due to accumulated energy-related stress. Additionally, one or more actions may be taken (e.g., at block 430) in response to the accumulated exposure of the equipment to the energy-related stress, for example, to reduce the energy-related stress on the equipment or resolve/mitigate exposure to the transient energy. Reducing the magnitude, duration, and quantity of the energy-related stress, for example, using the systems and methods disclosed herein, may extend the life of equipment insulation and of the equipment in general. As illustrated by graph 700 shown in FIG. 7, for example, the life expectancy of device(s)/component(s)/element(s)/aspect(s) (i.e., equipment) is generally related to the probability of failure.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

It is to be appreciated that the concepts, systems, circuits and techniques sought to be protected herein are not limited to use in the example applications described herein (e.g., power monitoring system applications) but rather, may be useful in substantially any application where it is desired to reduce/manage energy-related stress in an electrical system. While particular embodiments and applications of the present disclosure have been illustrated and described, it is to be understood that embodiments of the disclosure not limited to the precise construction and compositions disclosed herein and that various modifications, changes, and variations can be apparent from the foregoing descriptions without departing from the spirit and scope of the disclosure as defined in the appended claims.

Having described preferred embodiments, which serve to illustrate various concepts, structures and techniques that are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A method for reducing/managing energy-related stress in an electrical system, the energy-related stress comprising electrical, thermal and/or mechanical stress on equipment due to energy on the electrical system, the method comprising:

processing electrical measurement data from or derived from energy-related signals captured by at least one intelligent electronic device (IED) in the electrical system to identify and track at least one energy-related transient in the electrical system;

quantifying an impact of the at least one energy-related transient on equipment in the electrical system, the equipment having an associated stress tolerance to the at least one energy-related transient, the stress tolerance comprising a tolerance for electrical, thermal and/or mechanical stress of the equipment;

generating one or more transient-related alarms in response to the impact of the at least one energy-related transient being near, within or above a predetermined range of the stress tolerance of the equipment;

prioritizing the transient-related alarms based in part on at least one of the stress tolerance of the equipment, the stress associated with one or more transient events, and accumulated energy-related stress on the equipment; and taking one or more actions in the electrical system in response to the transient-related alarms to reduce energy-related stress on the equipment in the electrical system, wherein the one or more actions are taken based on at least one of the priority and severity of the transient-related alarms.

2. The method of claim 1, wherein taking the one or more actions includes:
   identifying at least one means to reduce the energy-related stress on the equipment in the electrical system;
   selecting one or more of the at least one means to reduce the energy-related stress based on at least one of the priority and severity of the transient-related alarms; and
   applying the selected one or more of the at least one means to reduce the energy-related stress.

3. The method of claim 2, wherein the one or more of the at least one means to reduce the energy-related stress is further selected based on an expected ability of the one or more of the at least one means to reduce at least one of the magnitude and duration of the at least one energy-related transient in the electrical system.

4. The method of claim 2, wherein the one or more of the at least one means to reduce the energy-related stress is further selected based on economic costs associated with acquiring and/or applying the one or more of the at least one means.

5. The method of claim 2, wherein the one or more of the at least one means to reduce the energy-related stress includes at least one transient mitigative device.

6. The method of claim 5, wherein the at least one transient mitigative device includes at least one of: a surge arrester, a lightning arrestor, a surge suppressor, and a transient voltage surge suppressor.

7. The method of claim 1, wherein the one or more actions are automatically performed by a control system associated with the electrical system, wherein the control system is communicatively coupled to the at least one IED, and/or to a cloud-based system, on-site/edge software, a gateway, and another head-end system associated with the electrical system.

8. The method of claim 7, wherein the electrical measurement data from or derived from energy-related signals captured by the at least one IED is processed on at least one of: the cloud-based system, the on-site software, the gateway, and the other head-end system associated with the electrical system, wherein the at least one IED is communicatively coupled to the at least one of: the cloud-based system, the on-site software, the gateway, and the other head-end system on which the electrical measurement data is processed.

9. The method of claim 1, wherein data associated with the at least one energy-related transient is stored and/or tracked over a predetermined time period.

10. The method of claim 9, wherein the predetermined time period is a user-configured time period.

11. The method of claim 1, wherein the impact of the at least one energy-related transient on the equipment is determined based on at least one of: the nature and source of the at least one energy-related transient, the susceptibility of the equipment to the at least one energy-related transient, the effect of the equipment on the at least one energy-related transient, and the cost sensitivity of a business's operation and/or infrastructure to the at least one energy-related transient.

12. The method of claim 1, wherein quantifying the impact of the at least one energy-related transient includes classifying the effects of the at least one energy-related transient on the equipment.

13. The method of claim 12, wherein the effects of the at least one energy-related transient are classified as at least one of: an intermittent interruption, a chronic degradation, a latent failure, and a catastrophic failure.

14. The method of claim 1, wherein the impact of the at least one energy-related transient is used to predict incipient failure of the equipment.

15. The method of claim 1, further comprising: presenting the priority and severity of the transient-related alarms on a display device.

16. The method of claim 15, wherein the display device is a display device of a computing device or system associated with the electrical system.

17. The method of claim 1, wherein the transient-related alarms inform an end-user, equipment manufacturer, and/or services team when the equipment nears and/or exceeds a pre-determined threshold of voltage stress energy.

18. The method of claim 1, wherein the stress tolerance of the equipment, and the accumulated energy-related stress on the equipment, are used to predict the end of life (EOL) of the equipment.

19. The method of claim 18, further comprising: communicating the EOL or near EOL of the equipment to an end-user, equipment manufacturer, and/or services team.

20. The method of claim 18, wherein the equipment includes at least one surge device not having a defined accumulated stress life, and the EOL of the at least one surge device is predicted based on EOL data for similar products/equipment using the accumulated energy-related stress data on the at least one surge device.

21. The method of claim 18, wherein the EOL of the equipment is predicted using mean time to failure (MTTF).

22. The method of claim 21, wherein the MTTF is based on an evaluation of at least energy-related stress.

23. The method of claim 1, further comprising: evaluating one or more characteristics of the at least one energy-related transient to isolate and identify transient origins.

24. The method of claim 1, further comprising: evaluating one or more characteristics of the at least one energy-related transient to identify the source(s) and location(s) of the at least one energy-related transient.

25. The method of claim 1, wherein the energy-related transient is at least one of a voltage transient and a current transient.

26. The method of claim 1, wherein the transient-related alarms are prioritized based on importance/criticality of electrical location where the at least one energy-related transient originated.

27. A system for reducing/managing energy-related stress in an electrical system, the energy-related stress comprising electrical, thermal and/or mechanical stress on equipment due to energy on the electrical system, the system comprising:
   a processor;
   a memory device coupled to the processor, the processor and the memory device configured to:
   process electrical measurement data from or derived from energy-related signals captured by at least one intelligent electronic device (IED) in the electrical system to identify and track at least one energy-related transient in the electrical system;
   quantify an impact of the at least one energy-related transient on equipment in the electrical system, the equipment having an associated stress tolerance to the at least one energy-related transient, the stress tolerance comprising a tolerance for electrical, thermal and/or mechanical stress of the equipment;
   generate one or more transient-related alarms in response to the impact of the at least one energy-related transient being near, within or above a predetermined range of the stress tolerance of the equipment;

prioritize the transient-related alarms based in part on at least one of the stress tolerance of the equipment, the stress associated with one or more transient events, and accumulated energy-related stress on the equipment; and take one or more actions in the electrical system in response to the transient-related alarms to reduce energy-related stress on the equipment in the electrical system, wherein the one or more actions are taken based on at least one of the priority and severity of the transient-related alarms.

\* \* \* \* \*